(12) United States Patent
Black et al.

(10) Patent No.: US 8,586,926 B2
(45) Date of Patent: Nov. 19, 2013

(54) ANTENNA-COUPLED ANTENNA ARRAYS

(75) Inventors: Stephen H. Black, Buelton, CA (US);
Michael A. Gritz, Goleta, CA (US);
Borys Pawel Kolasa, Santa Barbara, CA (US); Robert F. Burkholder, Goleta, CA (US)

(73) Assignee: Raytheon Company, Waltham, MA (US)

( * ) Notice: Subject to any disclaimer, the term of this patent is extended or adjusted under 35 U.S.C. 154(b) by 198 days.

(21) Appl. No.: 13/215,430

(22) Filed: Aug. 23, 2011

(65) Prior Publication Data

US 2013/0050015 A1    Feb. 28, 2013

(51) Int. Cl.
*G01J 5/00* (2006.01)

(52) U.S. Cl.
USPC ..................................................... 250/338.1

(58) Field of Classification Search
USPC ............................ 250/330, 332, 338.1, 338.4
See application file for complete search history.

(56) References Cited

U.S. PATENT DOCUMENTS

| | | | |
|---|---|---|---|
| 4,063,246 A | 12/1977 | Greiser | |
| 6,441,368 B1 | 8/2002 | Grinberg et al. | |
| 7,095,027 B1 | 8/2006 | Boreman et al. | |
| 7,679,057 B2 | 3/2010 | Gritz et al. | |
| 2003/0011528 A1 | 1/2003 | Marchand | |
| 2007/0001895 A1 | 1/2007 | Kolinko et al. | |
| 2009/0108202 A1 | 4/2009 | Gritz et al. | |
| 2013/0021203 A1* | 1/2013 | Gritz et al. | 342/368 |

OTHER PUBLICATIONS

Koert, P. et al., "Millimeter Wave Technology for Space Power Beaming", IEEE Transactions on Microwave Theory and Techniques, IEEE Service Center, vol. 40, No. 6, Jun. 1, 1992, pp. 1251-1258.
McSpadden, J. O. et al., "Theoretical and Experimental Investigation of a Rectenna Element for Microwave Power Transmission", IEEE Transactions on Microwave Theory and Techniques, IEEE Service Center, vol. 40, No. 12, Dec. 1, 1992, pp. 2359-2366.
Jamaluddin, M. H., et al.; Microstrip Dipole Antenna Analysis with Different Width and Length at 2.4 GHz; Asia-Pacific Conference on Applied Electromagnetics Proceedings; pp. 41-44, Dec. 20-21, 2005.
Anderson, Conrad, et al.; "A 24×28 Bolometer-Based Passive Millimeter Wave Imager," Department of Defense, Microsystems Technology Office; 10 pages, Mar. 25, 2002.
Greiser, John W.; "Coplanar Stripline Antenna," Transco Products, Inc. Venice, CA; pp. 47-49, Oct. 1976.
Ehmouda, J. et al.; "Steered Microstrip Phased Array Antennas," World Academy of Science, pp. 319-323, 2009.
Hrubesh, Lawrence W. et al.;"Thin Aerogel Films for Optical, Thermal, Acoustic, and Electronic Applications," Lawrence Livermore National Laboratory, 16 pages, Nov. 17, 1995.
Gonzalez, F. J. et al; "Two Dimensional Array of Antenna-Coupled Microbolometers," International Journal of Infrared and Millimeter Waves, pp. 785-797, 2002.

(Continued)

*Primary Examiner* — Mark R Gaworecki
(74) *Attorney, Agent, or Firm* — Lando & Anastasi, LLP

(57) ABSTRACT

According one embodiment, a non-heterodyne radiation imager includes a substrate having a ground plane layer. The radiation imager also includes a plurality of antenna elements operable to receive radiative input. Each support element of a plurality of support elements mechanically couples an antenna element of the plurality of antenna elements to the substrate. A plurality of energy detectors is operable to measure the radiative input received by the plurality of antenna elements.

19 Claims, 3 Drawing Sheets

(56) References Cited

OTHER PUBLICATIONS

Wilke, I.; Oppliger, Y.; Hermann, W.; and Kneubuhl, F.K.; Nanometer Thin-Film Ni—NiO—Ni Diodes for 30 THz Radiation,: Applied Physics A Solids and Surfaces, pp. 329-341, 1994.

Wilke, I.;; Hermann, W.; and Kneubuhl, F.K.; Integrated Nanostrip Dipole Antennas for Coherent 30 THz Infrared Radiation,: Applied Physics B Lasers and Optics, pp. 87-95, 1994.

Gritz, Michael A.; Gonzalez, Javier; Boreman, Glenn; "Fabrication of Infrared Antennas using Electron Beam Lithography," Micomachining Technology for Micro-optics and and Nano-optics, pp. 100-110, 2003.

Codreanu, L and Boreman, G; Influence of Dielectric Substrate on the Responsivity of Microstrip Dipole-Antenna-Coupled Infrared Microbolometers; Applied Optics, pp. 1835-1840, Apr. 1, 2002.

MacDonald, M; and Grossman, E; "Niobium Microbolometers for Far-Infrared Detection," IEEE Transactions on Microwave Theory and Techniques, vol. 43, No. 4, pp. 893-898, Apr. 1995.

Pierret, Robert; "Semiconductor Device Fundamentals,"School of Electrical and Computer Engineering, Purdue University, published by Addison-Wesley, pp. 563-609, 1996.

Balanis, Constantine; "Antenna Theory, Analysis and Design, second edition," John Wiley & Sons, Inc., pp. 722-784, 1997.

Gritz, M.; Puscasu, I.; Spencer, D.; Boreman, G.; "Fabircation of an Infrared Antenna-Coupled Microbolometer Linear Array Using Chrome as a Mask," American Vacuum Society, pp. 2608-2611, 2003.

* cited by examiner

ANTENNA-COUPLED ANTENNA ARRAYS

TECHNICAL FIELD

This invention relates generally to antenna systems, and more particularly, to antenna-coupled antenna arrays.

BACKGROUND OF THE INVENTION

Imagers may use antennas to detect electromagnetic radiation. Imagers may be useful for many applications, including scientific equipment, surveillance equipment, targeting equipment, and military applications. One example of an imager that uses antennas to detect electromagnetic radiation is a millimeter wave imager. Millimeter wave imagers may be used, for example, as whole body imaging devices for detecting objects concealed underneath a person's clothing. Some imagers may use heterodyne sensors, however, that increase the size and weight of the imager.

SUMMARY OF THE INVENTION

According one embodiment, a non-heterodyne radiation imager includes a substrate having a ground plane layer. The radiation imager also includes a plurality of antenna elements operable to receive radiative input. Each support element of a plurality of support elements mechanically couples an antenna element of the plurality of antenna elements to the substrate. A plurality of energy detectors is operable to measure the radiative input received by the plurality of antenna elements.

Particular embodiments of the present disclosure may provide one or more technical advantages. A technical advantage of one embodiment may include the capability to construct an imager array of antenna elements. A technical advantage of one embodiment may also include the capability to provide a thin, lightweight imager array of antenna elements. A technical advantage of one embodiment may also include the capability to provide a flexible or curved imager array of antenna elements that can conform to different environments and provide an increased field of view.

Certain embodiments of the present disclosure may include some, all, or none of the above advantages. One or more other technical advantages may be readily apparent to those skilled in the art from the figures, descriptions, and claims included herein.

BRIEF DESCRIPTION OF THE DRAWINGS

To provide a more complete understanding of the present invention and the features and advantages thereof, reference is made to the following description taken in conjunction with the accompanying drawings, in which.

DETAILED DESCRIPTION OF THE DRAWINGS

It should be understood at the outset that, although example implementations of embodiments are illustrated below, various embodiments may be implemented using a number of techniques, whether currently known or not. The present disclosure should in no way be limited to the example implementations, drawings, and techniques illustrated below.

Heterodyne detection is a method of detecting radiation by non-linear mixing with radiation of a reference frequency. In heterodyne detection, a signal of interest at some frequency is mixed with a reference "local oscillator" that is set at a reference frequency. The desired outcome of heterodyne detection is the difference frequency between the signal of interest and the reference frequency. This difference frequency may carry information (amplitude, phase, and frequency modulation) of the original signal of interest while oscillating at the reference frequency. Such heterodyne detectors, however, may be quite large. Non-heterodyne detectors, on the other hand, may use direct-detection techniques that allow for smaller and/or lighter detection systems. In a direct-detection system, the received signal is directly converted to the baseband signal without the use of a local oscillator.

Teachings of certain embodiments recognize the ability to provide a non-heterodyne detection system with an array of antenna elements. Unlike heterodyne systems, in which the size and weight of heterodyne components makes construction of antenna arrays unfeasible, non-heterodyne systems may allow for construction of an array of antenna elements. For example, removing heterodyne components such as local oscillators may reduce the weight and size of the detection system and allow for arrays of antenna elements.

Figure 1:
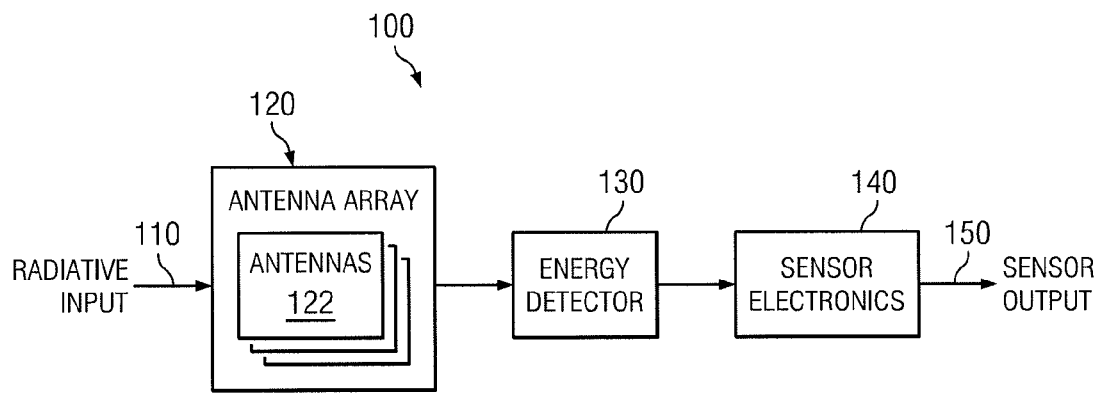
FIG. 1 shows a block diagram of a non-heterodyne imager having an antenna array according to one embodiment.

FIG. 1 is a block diagram of a non-heterodyne imager 100 according to one embodiment. Non-heterodyne imager 100 may receive a radiative input 110 and produce a sensor output 150. Radiative input 110 includes any electromagnetic signals, including, but not limited to, radio-frequency, optical, infrared, or microwave signals. Non-heterodyne imager 100 generates sensor output 150 based on the received radiative input 110. This sensor output 150 may be used, for example, by an imaging system to generate an image based on the radiative input 110.

In the illustrated embodiment, non-heterodyne imager 100 includes an antenna array 120, an energy detector 130, and sensor electronics 140. Antenna array 120 may include one or more antenna elements 122. In some embodiments, antenna elements 122 are arranged in an array, such as a two-dimensional array.

Examples of energy detector 130 may include any device operable to measure detected radiative input 110. Examples of energy detector 130 may include, but are not limited to rectifiers and photodectors. An example of a rectifier may include a diode rectifier, such as a Schottky diode. Photodetectors may include photovoltaic, photoconductive, and pyroelectric detectors. Examples of photodetectors may include bolometers and bandgap or semiconductor detectors. A bolometer may operate by sensing the increase in temperature as energy is absorbed. An exemplary bandgap or semiconductor detector operates by generating an electron current or a change in its electrical resistance in proportion to the infrared flux it receives. Materials such as mercury cadmium telluride and indium antimonide may have this characteristic. In both examples, a photodetector may be connected to microstrip feed lines from multiple antenna elements instead of directly to a single antenna element.

In some embodiments, imager 100 may also include sensor electronics 140. Sensor electronics 140 may include any device operable to receive measurements from energy detector 130 and produce sensor output 150. Sensor electronics 140 may include, but are not limited to, preamplifier, gain & level correction, multiplexer, and analog-to-digital conversion circuits. In some embodiments, sensor electronics 140 may be incorporated into an integrated circuit coupled to or within a substrate.

Figure 2:
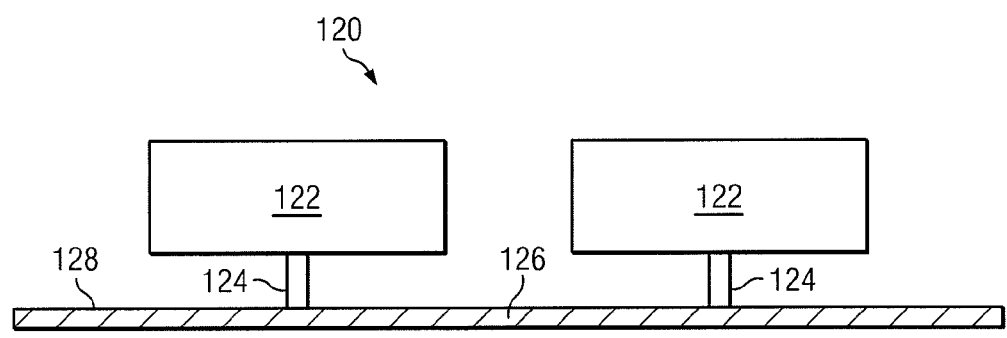
FIG. 2 shows a partial cross-section view of the antenna array of FIG. 1 according to one embodiment.

FIG. 2 shows a partial cross-section of antenna array 120 of FIG. 1 according to one embodiment. In this example, support elements 124 couple antenna elements 122 to substrate 126, which includes a ground plane 128. As will be explained in greater detail below, teachings of certain embodiments recognize that support elements 124 may help maintain a substantially uniform distance between antenna elements 122 and ground plane 128. In addition, teachings of certain embodiments recognize that support elements 124 may allow antenna elements 122 to be coupled to substrates of different shapes and materials, including planar, curved, and flexible substrates, as will be explained in greater detail below with regard to FIGS. 4A-4B.

In the illustrated example of FIG. 2, antenna array 120 may include several antenna elements 122 coupled to a substrate 126 by support elements 124. In some embodiments, substrate 126 may include a ground plane 128. Ground plane 128 may act as a near-field reflection point for antenna elements 122. Additional details regarding substrate 126 and ground plane 128 are provided below with regard to FIGS. 4A-4B.

In the illustrated example, antenna elements 122 may be separated by some distance from ground plane 128. In some circumstances, non-heterodyne imager 100 may become out of focus if the antenna elements 122 are not maintained at a substantially uniform distance from ground plane 128. Accordingly, teachings of certain embodiments recognize the use of support elements that help maintain a substantially uniform distance between antenna elements 122 and the ground plane 128.

In one example embodiment, support elements 124 may be sized so as to maintain a distance between antenna elements 122 and ground plane 128 equal to approximately one quarter of the center wavelength of antenna elements 122. As one example, antenna array 120 may be used in a millimeter wave imager which may be configured to detect signals with wavelengths between one and ten millimeters. Such millimeter wave imagers may be used, for example, as whole body imaging devices used for detecting objects concealed underneath a person's clothing. In the millimeter wave imaging example, support elements 124 may maintain antenna elements 122 between 250 and 2500 microns from the ground plane of substrate 126. In one example embodiment, antenna elements 122 may be maintained 500 microns from the ground plane of substrate 126.

In some embodiments, support elements 124 may provide an electrical coupling as well as a mechanical coupling between antenna elements 120 and substrate 126. In some embodiments, antenna array 120 may include two support elements 124 for every antenna element 122. For example, providing two separate support elements 124 may allow for two electrical connections to antenna elements 122 so as to close the circuit between antenna element 122 and energy detector 130. In other embodiments, only one support element 124 is provided between each antenna element 122 and substrate 126. In some examples, a single support element 124 may provide multiple electrical connections to an antenna element 122. In other embodiments, support element 124 may provide a single electrical connection to antenna element 122, and additional electrical connections to antenna elements 122 may be provided by other components.

Figure 3A:
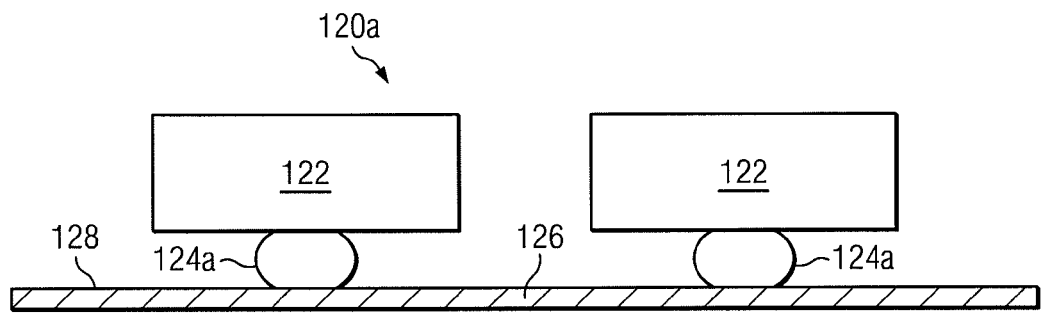
FIG. 3A shows an example partial cross-section view of the antenna array of FIG. 1 with support elements arranged in a ball grid array according to one embodiment.
Figure 3B:
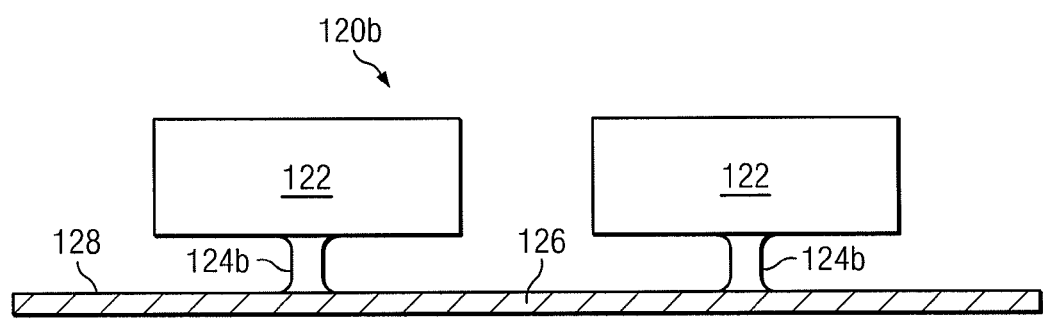
FIG. 3B shows an example partial cross-section view of the antenna array of FIG. 1 with support elements made from a conductive adhesive according to one embodiment.
Figure 3C:
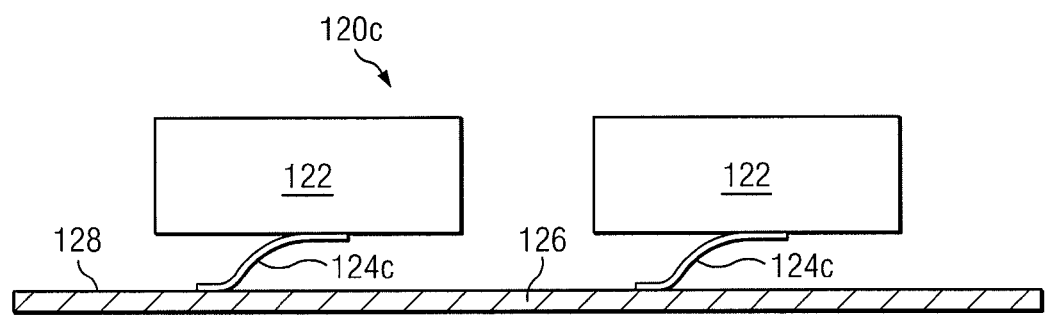
FIG. 3C shows an example partial cross-section view of the antenna array of FIG. 1 with support elements representing microelectromechanical system (MEMS) leaf spring contacts according to one embodiment.

Examples of support elements 124 may include a variety of different materials and structures. FIGS. 3A, 3B and 3C show three examples of antenna array 120 with different support elements 124. In FIG. 5A, antenna array 120a features support elements 124a arranged in a ball grid array. A ball grid array is a type of surface mount packaging used for integrated circuits. In some embodiments, a ball grid array may use materials such as gallium arsenide or silicon. In FIG. 3B, antenna array 120b features support elements 124b made from a conductive adhesive. Teachings of certain embodiments recognize that conductive adhesive may provide a conductive connection between antenna elements 122 and substrate 126 as well as a mechanical connection between antenna elements 122 and substrate 126. Examples of conductive adhesive may include but are not limited isotropic conductive adhesive and anistropic conductive adhesive. Isotropic conductive adhesives may conduct equally in all directions whereas anistropic conductive materials may be conductive only in a particular direction. FIG. 3C shows an array 400c featuring support elements 124c representing microelectromechanical system (MEMS) leaf spring contacts. MEMS generally refers to the technology of various small mechanical devices that may be driven by electricity. MEMS technology can be implemented using a number of different materials and manufacturing techniques. Examples of MEMS materials may include, but are not limited to, silicon, polymers, and metals. In addition to the examples of FIGS. 3A-3C, further examples of support elements 124 may include, but are not limited to, metallic coldwelds, which may be formed using a metal such as indium or an alloy thereof; solder connections; socket connections; and pressure contacts.

Figure 4A:
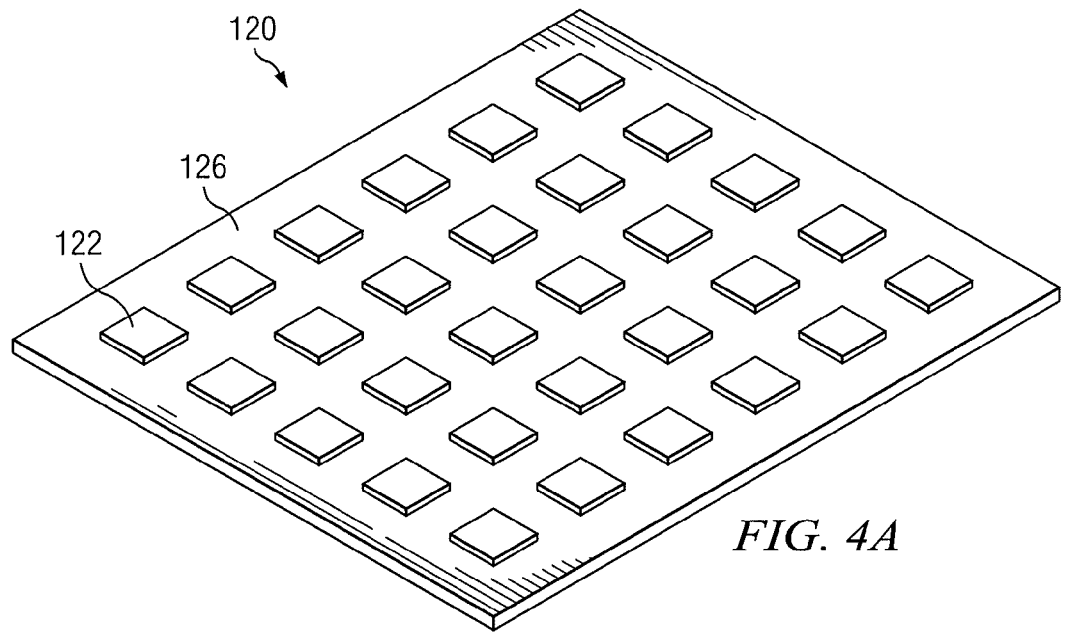
FIG. 4A shows a perspective view of an example of the antenna array of FIG. 1 with a planar substrate according to one embodiment.
Figure 4B:
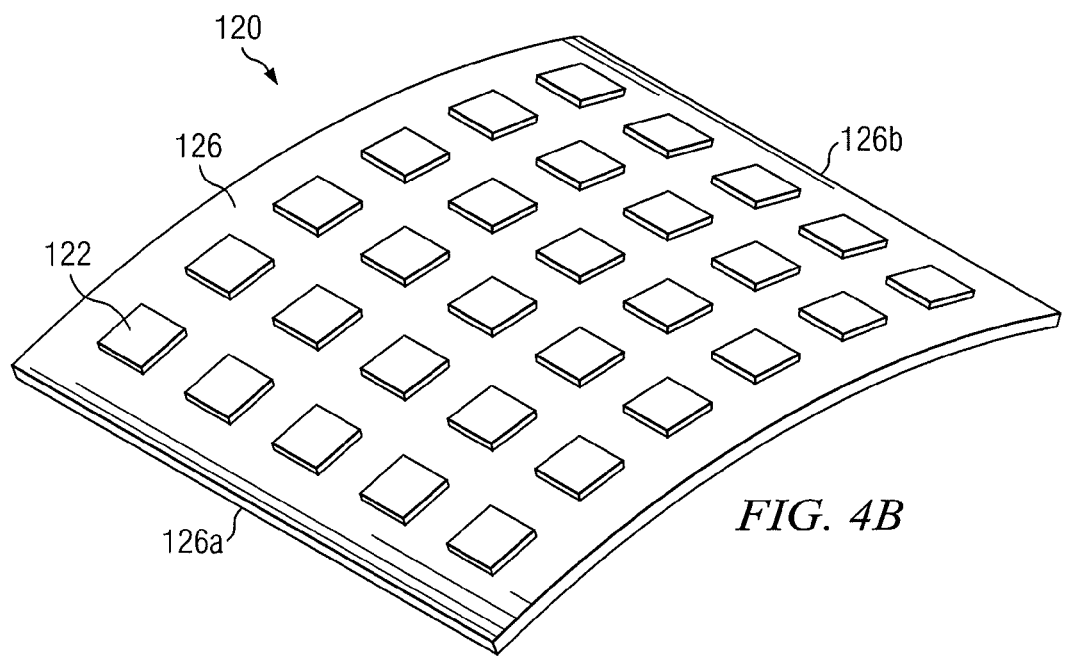
FIG. 4B shows a perspective view of an example of the antenna array of FIG. 1 with a non-planar substrate according to one embodiment.

FIGS. 4A and 4B show perspective views of antenna array 120 according to example embodiments. Teachings of certain embodiments recognize the capability to maintain a substantially uniform distance between antenna elements 122 and ground plane 128 for planar, curved, and/or flexible substrates 126.

In the example of FIG. 4A, substrate 126 is a planar substrate supporting a two-dimensional array of antenna elements 122. In the example of FIG. 4B, substrate 126 is a curved substrate supporting a two-dimensional array of antenna elements 122. In FIG. 2B, substrate 126 is curved such that substrate 126 forms a substantially-uniform arc between end 126a and end 126b. In some embodiments, substrate 126 may be dimensioned and curved such that end 126a is proximate to end 126b forming a tube-like structure. For example, in some embodiments, substrate 126 may be configured to curve around a column to provide radiation detection in a near 360 degree field of view.

Substrate 126 may include any material suitable for providing physical support to antenna elements 122. In one example embodiment, substrate 126 is a printed circuit board. In some embodiments, substrate 126 is made from a dielectric material. Examples of materials for substrate 126 may include, but are not limited to, ceramic, polymer, polyamide, fluorocarbon, and epoxy laminate material.

In some embodiments, substrate 126 is comprised of a rigid material. In other embodiments, substrate 126 is comprised of a flexible material, such as a flexible printed wiring board, that allows the curvature of substrate 126 to be changed without cracking substrate 126. Teachings of certain embodiments recognize that manufacturing substrate 124 from a flexible material may allow substrate 126 to adapt to a variety of environments. As one example, a flexible substrate 126 may be wrapped around a variety of columns regardless of the curvature and/or diameter of the column.

In some embodiments, substrate 126 may include ground plane 128. Ground plane 128 may act as a near-field reflection point for antenna elements 122. In some embodiments, ground plane 128 may be formed from a metallic layer, such as a gold or copper layer. For example, ground plane 128 may be formed from a gold-plated copper layer on a printed circuit board substrate 126. In some embodiments, the printed circuit board substrate 126 may have openings for each antenna element 122 to electrically connect to the ground plane 128.

Modifications, additions, or omissions may be made to the systems and apparatuses described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order.

Although several embodiments have been illustrated and described in detail, it will be recognized that substitutions and alterations are possible without departing from the spirit and scope of the present invention, as defined by the appended claims.

What is claimed is:

1. A non-heterodyne millimeter-wave radiation imager, comprising:
a substrate comprising a ground plane layer, the substrate having a first end and a second end opposite the first end, wherein the substrate is curved such that the substrate forms a substantially-uniform arc between the first end and the second end;
a plurality of antenna elements configured to receive millimeter-wave radiative input;
a plurality of support elements, each support element of the plurality of support elements mechanically and electrically coupling an antenna element of the plurality of antenna elements to the substrate, wherein the plurality of support elements maintain the plurality of antenna elements at a distance from the ground plane approximately one quarter of the wavelength of the millimeter-wave radiative input; and
a plurality of energy detectors, each energy detector being operable to measure the millimeter-wave radiative input received an antenna element of the plurality of antenna elements.

2. A non-heterodyne radiation imager, comprising:
a substrate comprising a ground plane layer;
a plurality of antenna elements operable to receive radiative input;
a plurality of support elements, each support element of the plurality of support elements mechanically and electrically coupling an antenna element of the plurality of antenna elements to the substrate; and
a plurality of energy detectors operable to measure the radiative input received by the plurality of antenna elements.

3. The radiation imager of claim 2, wherein the plurality of support elements provide substantially-uniform spacing between each antenna element and the ground plane layer.

4. The radiation imager of claim 2, wherein the plurality of support elements maintain the plurality of antenna elements 250 to 2500 microns from the ground plane layer.

5. The radiation imager of claim 2, wherein the substrate is non-planar.

6. The radiation imager of claim 2, the substrate having a first end and a second end opposite the first end, and the substrate is curved such that the first end is proximate to the second end.

7. The radiation imager of claim 2, the substrate having a first end and a second end opposite the first end, and the substrate is curved such that the substrate forms a substantially-uniform arc between the first end and the second end.

8. The radiation imager of claim 2, the substrate having a first end and a second end opposite the first end, and the substrate is flexible such that the substrate is operable to be curved from a planar shape to a non-planar shape.

9. The radiation imager of claim 2, wherein the energy detector comprises a rectifier circuit.

10. The radiation imager of claim 2, wherein the energy detector comprises a photodetector element.

11. The radiation imager of claim 2, wherein the substrate is comprised of a dielectric material.

12. The radiation imager of claim 2, wherein the plurality of support elements comprises a plurality of metallic cold welds.

13. The radiation imager of claim 2, wherein the plurality of support elements comprises a plurality of conductive adhesive patches.

14. The radiation imager of claim 2, wherein the plurality of support elements comprises a plurality of soldered connections.

15. The radiation imager of claim 2, wherein the plurality of support elements comprises a plurality socket connectors.

16. A method, comprising:
receiving radiative input at a plurality of antenna elements of a non-heterodyne imaging array;
mechanically coupling each antenna element of a plurality of antenna elements to a substrate, the substrate comprising a ground plane layer; and
measuring the radiative input received by the plurality of antenna elements.

17. The method of claim 16, wherein mechanically coupling each antenna element of the plurality of antenna elements to the substrate further comprises maintaining the antenna elements at a substantially-uniform distance from the ground plane layer.

18. The method of claim 16, the substrate having a first end and a second end opposite the first end, and the substrate is curved such that the substrate forms a substantially-uniform arc between the first end and the second end.

19. The method of claim 16, the substrate having a first end and a second end opposite the first end, and the substrate is flexible such that the substrate is operable to be curved from a planar shape to a non-planar shape.

* * * * *